(12) United States Patent
Abe

(10) Patent No.: US 7,144,812 B2
(45) Date of Patent: Dec. 5, 2006

(54) METHOD OF FORMING COPPER WIRE

(75) Inventor: Kazuhide Abe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/748,254

(22) Filed: Dec. 31, 2003

(65) Prior Publication Data
US 2004/0209462 A1   Oct. 21, 2004

(30) Foreign Application Priority Data
Apr. 18, 2003   (JP)   ............................. 2003-113648

(51) Int. Cl.
*H01L 21/44*   (2006.01)
(52) U.S. Cl. .................. 438/687; 257/E21.584
(58) Field of Classification Search ................ 438/687, 438/627, 628, 642, 643, 644
See application file for complete search history.

(56) References Cited

U.S. PATENT DOCUMENTS

| | | | |
|---|---|---|---|
| 5,391,517 A * | 2/1995 | Gelatos et al. ............ | 438/643 |
| 6,211,084 B1 | 4/2001 | Ngo et al. ................. | 438/687 |
| 6,271,595 B1 * | 8/2001 | McGahay et al. ......... | 257/762 |
| 6,303,505 B1 * | 10/2001 | Ngo et al. ................. | 438/687 |
| 6,376,353 B1 | 4/2002 | Zhou et al. ................ | 438/612 |
| 6,410,435 B1 * | 6/2002 | Ryan ......................... | 438/687 |
| 6,479,384 B1 * | 11/2002 | Komai et al. .............. | 438/687 |
| 6,492,266 B1 | 12/2002 | Ngo et al. ................. | 438/687 |
| 6,596,888 B1 * | 7/2003 | McElwee-White et al. ... | 556/59 |
| 6,787,480 B1 * | 9/2004 | Aoki et al. ................ | 438/775 |
| 6,984,893 B1 * | 1/2006 | Yin et al. .................. | 257/762 |
| 7,008,871 B1 * | 3/2006 | Andricacos et al. ....... | 438/652 |

FOREIGN PATENT DOCUMENTS

| | | |
|---|---|---|
| JP | 07-235538 | 9/1995 |
| JP | 08-017824 | 1/1996 |
| JP | 2000-311897 | 11/2000 |
| JP | 2001-093976 | 4/2001 |

OTHER PUBLICATIONS

K. Musaka et al., "Thermal Stress and Reliability Characterization of Barriers for Cu Interconnects" Interconnect Technology Conference, 2001, Proceedings of the IEEE 2001 International, Jun. 4-6, 2001 pp. 83-85.*

(Continued)

*Primary Examiner*—W. David Coleman
(74) *Attorney, Agent, or Firm*—Rabin & Berdo, PC

(57) ABSTRACT

Cu is nitrided to form a nitride of Cu 5 on a Cu wiring layer 1. A diffusion base material layer 6 used as a diffusion source and a barrier metal layer 7, which are interdiffused with Cu, are formed on the nitride of Cu 5. With heat treatment, the Cu wiring layer 1 and the diffusion base material layer 6 are interdiffused to form an alloy layer of Cu 8 between the Cu wiring layer 1 and the barrier metal layer 7.

18 Claims, 3 Drawing Sheets

OTHER PUBLICATIONS

Piijun Ding et al., "Cu Barrier/Seed Technology Development for Sub-0.10 Micron Copper Chip", Solid-State and Integrated Circuit Technology 2001, Proceedings, 6th International Conference on, vol. 1, Oct. 22-25, 2001, pp. 405-409.*

S. Sankaran, "Development of TiSiN Diffusion Barriers for Cu/SiLK Metallization Schemes" Interconnect Technology Conference, 2000. Proceedings of the IEEE 2000 International, Jun. 5-7, 2000 pp. 40-42.*

Antoni Bukaluk "AES studies of interdiffusion in thin-film copper-palladium multilayer structures", Jul. 1999, Elvisier Science, Vaccum, vol. 54, pp. 279-283.*

A. Christensen, et al., "Phase diagrams for surface alloys", Physical Review B, APS, vol. 56, No. 10, pp. 5822-5834.*

* cited by examiner

METHOD OF FORMING COPPER WIRE

BACKGROUND OF THE INVENTION

1. Field of the Invention

The present invention relates to a method of manufacturing a semiconductor device having copper wirings, and particularly to a method of forming an upper wiring on a copper wiring with satisfactory adhesion.

2. Description of the Related Art

With micro-fabrication of a semiconductor element or chip, an RC-delay share of a signal delay of the element is becoming innegligible. Therefore, the use of Cu (1.8 μΩ·cm) smaller in specific resistivity than an aluminum (Al) alloy (3 μΩ·cm) has been discussed from the viewpoint of a wiring material. A self-diffusion coefficient ($3.04 \times 10^{-10}$ cm$^2$/s) of copper (Cu) is larger than a self-diffusion coefficient ($8.21 \times 10^{-7}$ cm$^2$/s) of Al, and electromigration (EM) resistance of a Cu wiring higher than that of an AL wiring is obtained. There has however been a demand for further improvements in EM resistance of the Cu wiring. Further, the elucidation of an EM mechanism has been brought forward.

In a Cu damascene wiring technique, a silicon nitride (SiN) film or the like formed by a plasma chemical vapor deposition (CVD) method is deposited on a Cu wiring layer. It has been reported that since a Cu/SiN interface is poor in adhesion as compared with a Cu/barrier metal interface, the diffusion of Cu atoms along such an interface principally exerts control over the life of wiring. While a method of reducing an oxidation layer of a Cu surface, and the like have been discussed to improve the adhesion of an Cu/SiN interface, it is difficult to significantly improve the adhesion under the present situation.

It has also been reported that CoWP having a thickness ranging from 10 nm to 20 nm as an alternative to SiN caps over a Cu layer to thereby significantly improve EM resistance. It can be said that the replacement of all interfaces between Cu and different types of materials with those between Cu and metals is highly significant. However, even if the interfaces between Cu and the different types of materials are changed into those with the metals, the adhesion of the interfaces depends on materials to be applied.

A description will be made of the relationship between Cu and barrier metals by way of example. It has been reported that a Cu/Ta structure is improved in EM resistance as compared with a Cu/TaN structure. Cu thin films deposited on the barrier metals of their references are heat-treated at a high temperature and thereafter compared as to surface mophology. Consequently, the Cu film is coagulated in the case of the Cu/TaN structure. On the other hand, the Cu/Ta structure holds a smooth continuous film. The ability of the Cu/Ta structure to maintain the smooth surface of Cu film means that the adhesion of the interface is satisfactory. It is apparent that the barrier metal good in adhesion is improved in EM resistance as compared with Cu. This idea is estimated to be similar even as to a cap metal on Cu.

In addition to the application of the barrier metal good in adhesion to Cu, a method of forming an alloy layer of Cu between a Cu wiring and a barrier metal to thereby improve adhesion of Cu to the barrier metal has been disclosed in, for example, prior art documents (see Japanese Patent Application Nos. Hei 7(1995)-235538 and 8(1996)-17824 and Japanese Patent Application Nos. 2000-311897 and 2001-93976).

However, the prior art has a problem in that since a Cu wiring layer and a reactive layer are caused to directly react with each other to thereby form an alloy layer of copper, control on the reaction is difficult and the thickness of the alloy layer cannot be controlled. As a result, a problem arises in that wiring resistance rises.

SUMMARY OF THE INVENTION

According to the present invention, a compound layer like a nitride of Cu, and a reactive layer and a barrier metal layer interdiffused with a Cu layer are respectively formed on a Cu wiring layer and a compound of Cu by their lamination. With the application of heat treatment, the Cu wiring layer and the reactive layer are interdiffused to form an alloy layer. A barrier metal layer containing a substance interdiffused with Cu is formed on the Cu wiring layer and alloyed by heat treatment to form an alloy layer of Cu and a barrier metal layer on the Cu wiring layer in a laminated form.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
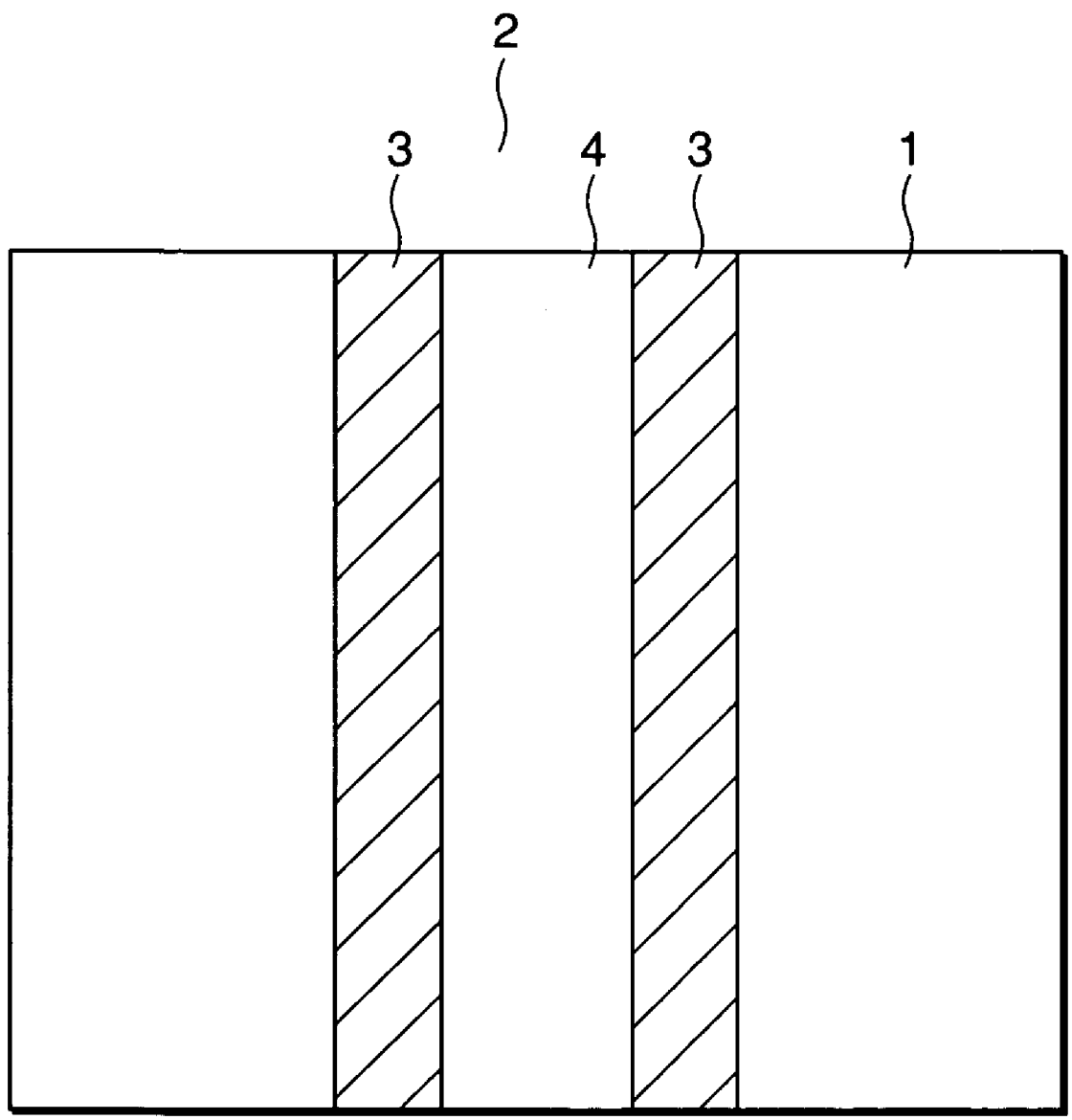
FIG. 1 is a process diagram for describing an embodiment of the present invention.

According to a method similar to the prior art, a wiring trench 2 is defined in a first insulating layer 1 made up of silicon oxide (SiO$_2$) deposited on a semiconductor substrate. Thereafter, first barrier metal layers 3 and a seed layer are formed in the wiring trench 2, and Cu is embedded therein by a Cu electrolytic plating method. Afterwards, the resultant Cu-embedded layer is subjected to heat-treatment for stabilizing the hardness, crystallizability, specific resistivity, etc. of a Cu wiring layer, followed by planarization thereof by a CMP method, whereby a corresponding buried Cu wiring layer 4 is formed (see FIG. 1).

Figure 2:
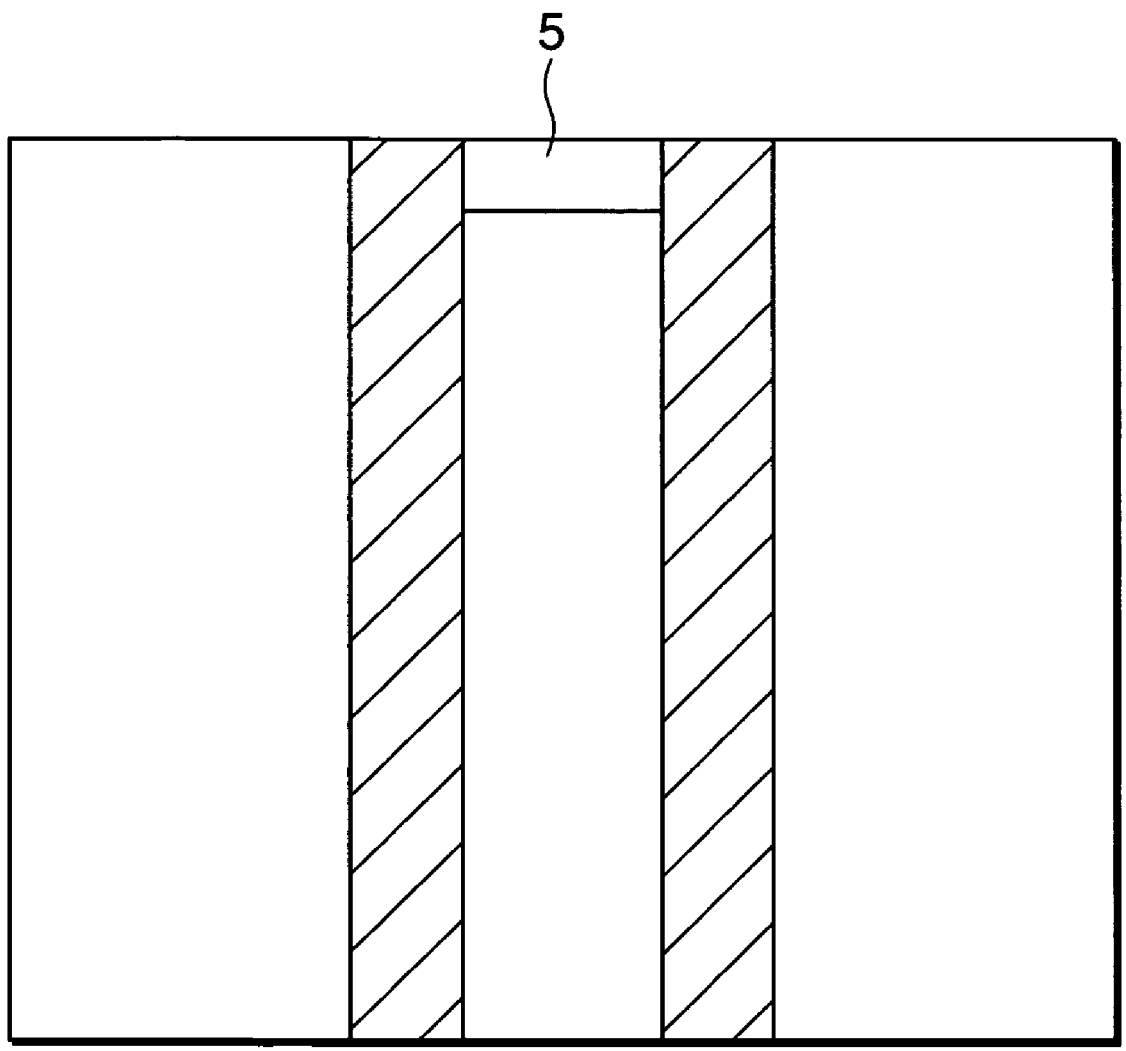
FIG. 2 is a process diagram following FIG. 1, for describing the embodiment of the present invention.

Next, a second barrier metal layer 5 is formed as shown in FIG. 2. Nitriding processing conditions will be set in the following manner: For example, a substrate temperature is 380° C., the flow rate of NH$_3$ is 70 sccm, the flow rate of N$_2$ is 20 sccm, the pressure is 5 Torr, high-frequency power (RF) is 450 W, the distance between electrodes is 650 mil, processing time ranges from 10 seconds to 30 seconds, and a film thickness thereof ranges from 1 nm to 50 nm, respectively. The second barrier metal layer 5 is not necessarily limited to the nitrided Cu wiring layer 4. It may be replaced by, for example, an oxidized Cu layer, a boronized Cu layer, a sulphidized Cu layer, or a phosphatized Cu layer having a function similar to the nitrided Cu wiring layer 4.

Figure 3:
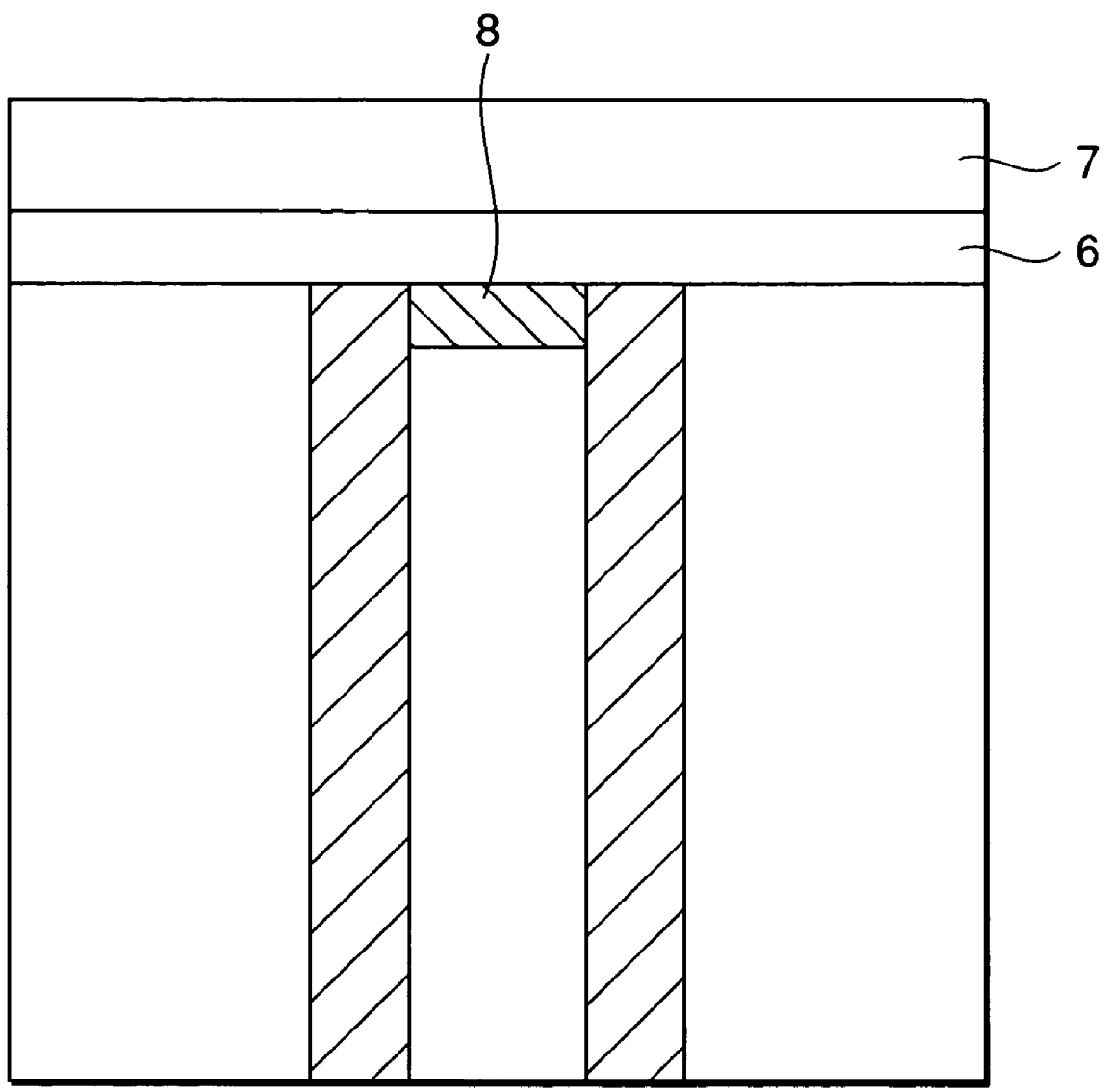
FIG. 3 is a process diagram following FIG. 2, for describing the embodiment of the present invention.

Next, a diffusion base material layer 6 and a third barrier metal layer 7 are formed on the Cu wiring layer 4 containing the exposed second barrier metal layer 5 as shown in FIG. 3. For instance, a titanium (Ti) film having a thickness of 10 nm is laminated as the diffusion base material layer 6, and a TaN film having a thickness of 15 m is laminated as the third barrier metal layer 7. The Ti film is formed under the condition that, for example, Ti is used for a target, an Ar gas is used as a process gas, the pressure of a sputtering atmosphere is set to 3 mTorr, DC power is set as 0.5 kW, and the growth temperature is 100° C.

With the application of heat treatment, for example, Ti atoms and Cu atoms in the Cu wiring layer 4 are mutually diffused from the diffusion base material layer 6, so that an alloy layer 8 is formed. As the heat treatment, for example, heat treatment at a temperature ranging from 100° C. to 350° C. for 1 to 300 minutes is performed in a mixed atmosphere of nitrogen ($N_2$) and hydrogen ($H_2$).

Interposing the second barrier metal layer 5 between the diffusion base material layer 6 which serves as a diffusion source and the Cu wiring layer 4 in the present embodiment suppresses an alloying reaction developed by sudden diffusion of their diffused atoms and controls an increase in the thickness of the alloy layer. Namely, the second barrier metal layer serves as a reaction inhibition layer. Although not shown in the drawing, an upper wiring is next formed by the known technology to thereby form a connection to a plug. As a result, the adhesion between the copper wiring layer and its corresponding upper wiring layer is enhanced because an interface between the diffusion base material layer 6 and the Cu wiring layer 4 brings about an anchor effect with the formation of the alloy layer 8.

While the present embodiment has described the case in which Ti is applied as the diffusion base material layer, materials such as B, S, Sn, Ga, Ge, Hf, In, Mg, Ni, Nb, Pd, P, Sc, Se, Si, Zn, Ag, etc. or an alloy of these materials may be used as materials which cause interdiffusion with Cu or react with Cu. Although a description has been made of the case in which TaN is used as the third barrier layer, the third barrier layer is not necessarily limited to TaN. The third barrier layer may be replaced by other materials each having the function of suppressing the diffusion of Cu, e.g., CoSn, CoZ, CoW, Ta, TaN, W, WN, etc.

Since the formation of the alloy layer by interdiffusion between the Cu wiring layer and the material coating over the Cu wiring layer both subjected to heat treatment is performed by inserting the reaction inhibition layer containing Cu therebetween upon its formation as described above, the adhesion at the interface between the Cu wiring layer and the coating material on the Cu wiring layer can be enhanced owing to the anchor effect. Since the reaction inhibition layer prevents an overreaction simultaneously with it, an increase in wiring resistance can be also suppressed.

While the alloying has been performed after the formation of the reaction inhibition layer in the present embodiment, the alloy layer may be formed using a barrier film containing a diffusion base material. As the film for the alloy layer, may be mentioned, for example, a 20 nm-thick titanium silicon nitride (TiSiN) film containing a Ti element which serves as a diffusion source. The TiSiN film is formed on condition that, for example, a target is $Ti_3Si_5$, an $Ar/N_2$ mixed gas is used as a process gas, the pressure of a sputtering atmosphere is 3 mTorr, DC power is 0.5 kW, and the growth temperature is 100° C. In this case, a TiSiN film is laminated on a Cu wiring layer and then subjected to heat treatment to cause interdiffusion between Ti and Cu, whereby an alloy layer is formed.

In the present invention, the reaction inhibition layer for inhibiting the reaction of the alloy of the materials for the Cu wiring layer and the upper wiring for coating over the Cu wiring layer is formed at the interface therebetween to thereby perform the alloying reaction. It is therefore possible to control the thickness of the formed alloy layer and realize the Cu wiring improved in EM resistance and low in resistance.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:
    embedding a copper wiring layer in an insulation layer;
    forming a compound of copper into the copper wiring layer from thereabove;
    forming a reactive layer on the compound of copper from thereabove;
    forming a barrier metal layer on the reactive layer from thereabove; and
    interdiffusing the copper compound and the reactive layer by heat treatment to thereby form an alloy layer of copper between the copper wiring layer and the barrier metal layer.

2. The method according to claim 1, wherein the compound of copper is obtained by processing the copper wiring layer according to a method selected out of nitriding, oxidizing, boronizing, sulphidizing or phosphidizing.

3. The method according to claim 1, wherein the reactive layer is at least one kind of material selected from Ti, B, S, Sn, Ga, Ge, Hf, In, Mg, Ni, Nb, Pd, P, Sc, Se, Si, Zn, and Ag.

4. The method according to claim 1, wherein a barrier metal for the barrier metal layer is a material selected from CoSn, CoZ, CoW, Ti, TiN; Ta, TaN, W, and WN.

5. The method according to claim 1, wherein the copper wiring layer is buried and the compound of copper is formed on an exposed surface of the copper wiring layer.

6. The method according to claim 1, wherein the alloy layer of copper is not formed by an ion exchange reaction.

7. The method according to claim 1, wherein the heat treatment is above 100° C.

8. The method according to claim 1, wherein the steps are performed in the sequence recited.

9. The method according to claim 5, wherein the insulation layer comprises a semiconductor substrate, and wherein the compound of copper is formed at a surface of the semiconductor substrate.

10. A method of manufacturing a semiconductor device, comprising:
    embedding a copper wiring layer in an insulation layer;
    forming a compound of copper into the copper wiring layer from thereabove;
    forming a barrier metal layer containing a substance interdiffused with the copper wiring layer on the compound of copper from thereabove; and
    heat treating and allowing the compound of copper and the barrier metal layer to react by the heat treatment to thereby form an alloy layer of copper and a barrier metal layer on the copper wiring layer.

11. The method according to claim 10, wherein the compound of copper is obtained by processing the copper wiring layer according to a method selected out of nitriding, oxidizing, boronizing, sulphidizing or phosphidizing.

12. The method according to claim 10, wherein the substance reacted with the copper is at least one kind of material selected from Ti, B, S, Sn, Ga, Ge, Hf, In, Mg, Ni, Nb, Pd, P, Sc, Se, Si, Zn, and Ag.

13. The method according to claim 10, wherein a barrier metal for the barrier metal layer is a material selected from CoSn, CoZ, CoW, Ti, TiN, Ta, TaN, W, and WN.

14. The method according to claim 10, wherein the copper wiring layer is buried and the compound of copper is formed on an exposed surface of the copper wiring layer.

15. The method according to claim 10, wherein the alloy layer of copper is not formed by an ion exchange reaction.

16. The method according to claim 10, wherein the heat treating is above 100° C.

17. The method according to claim 10, wherein the steps are performed in the sequence recited.

18. The method according to claim 14, wherein the insulation layer comprises a semiconductor substrate, and wherein the compound of copper is formed at a surface of the semiconductor substrate.

* * * * *